United States Patent [19]

Nashimoto

[11] Patent Number: 5,661,318

[45] Date of Patent: Aug. 26, 1997

[54] JUNCTION TYPE FIELD-EFFECT TRANSISTOR

[75] Inventor: Yasunobu Nashimoto, Tokyo, Japan

[73] Assignee: NEC Corporation, Japan

[21] Appl. No.: 395,802

[22] Filed: Feb. 28, 1995

[30] Foreign Application Priority Data

Feb. 28, 1994 [JP] Japan ............................... 6-030678
Oct. 28, 1994 [JP] Japan ............................... 6-265702

[51] Int. Cl.$^6$ ....................... H01L 31/0328; H01L 29/80
[52] U.S. Cl. ............................................ 257/279; 257/192
[58] Field of Search ................................. 257/279, 256, 257/262, 272, 274, 192, 194

[56] References Cited

U.S. PATENT DOCUMENTS 4,893,155  1/1990  Ohata ............................... 257/194

FOREIGN PATENT DOCUMENTS 63-127574  5/1988  Japan ............................... 257/279
1-200674   8/1989  Japan ............................... 257/279

*Primary Examiner*—Wael Fahmy

[57] ABSTRACT

A junction type field-effect transistor in accordance with the invention includes a multi-layer structure which includes a first undoped semiconductor layer, a first first-conductive type semiconductor layer and a second undoped semiconductor layer. These layers are deposited and epitaxially grown in this order on a surface of a semiconductor substrate. A part of the first first-conductive type semiconductor layer is exposed outside in a surface of the multi-layer structure. A second-conductive semiconductor layer is joined to the multi-layer structure through the surface of said multi-layer structure. A drain electrode line and a source electrode line are kept in ohmic contact with the second-conductive type semiconductor layer, and are disposed at opposite sides of a location at which the first first-conductive type semiconductor layer is joined to the second-conductive type semiconductor layer. The invention makes it possible to form the first first-conductive type semiconductor layer thinner, and thereby achieve a gate length shorter than a minimum length achievable by lithography technique.

26 Claims, 9 Drawing Sheets

FIG. 10A
FIG. 10B
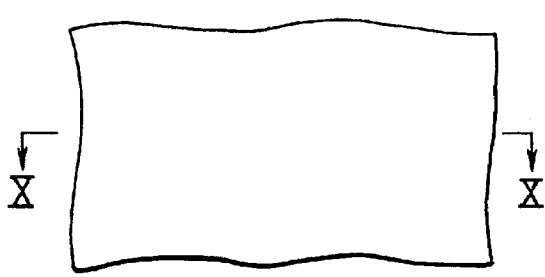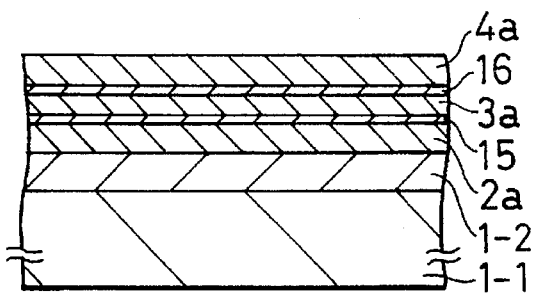
FIG. 11A
FIG. 11B
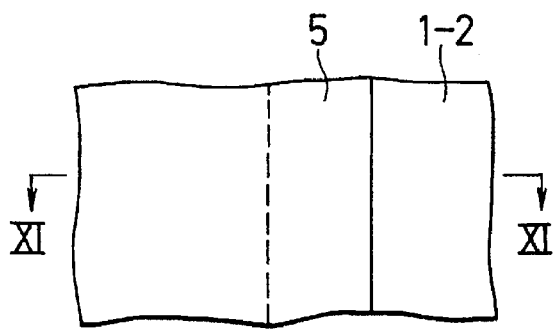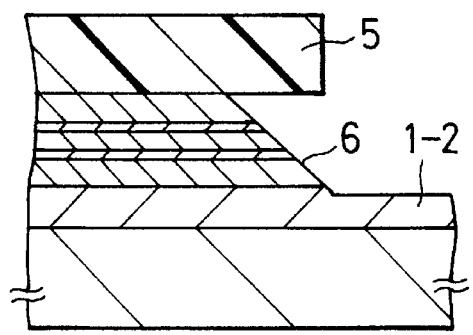
FIG. 12A
FIG. 12B
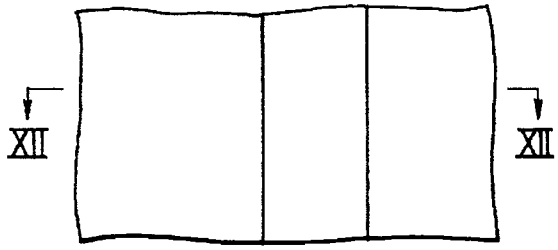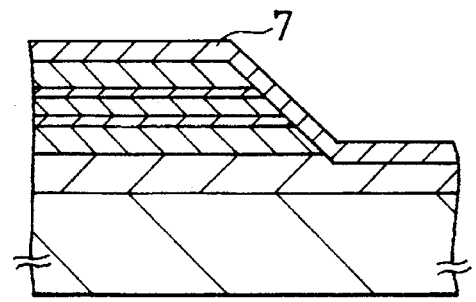

JUNCTION TYPE FIELD-EFFECT TRANSISTOR

BACKGROUND OF THE INVENTION

1. Field of the Invention

The invention relates to a semiconductor device, and more particularly to a junction type field-effect transistor (FET) capable of high speed operation.

2. Description of the Related Art

A junction type field-effect transistor, which is hereinbelow referred to simply as a junction type FET, adopts p-n junction in a gate, and changes a width of a channel by controlling a width of a depleted layer extending from the junction with a voltage applied to the p-n junction, to thereby control a current running between a source electrode and a drain electrode. A junction type FET including a chemical compound semiconductor, in particular, such as GaAs is superior in high frequency characteristics.

FIG. 1 illustrates a typical structure of a prior junction type FET. On a semi-insulating GaAs substrate 101 is formed a n-type GaAs layer 107 operating as a channel layer. On the n-type GaAs layer 107 are formed $p^+$ type GaAs layer 103, a drain electrode line 111 and a source electrode line 112. The $p^+$ type GaAs layer 103 is disposed between the drain electrode line 111 and the source electrode line 112. On the $p^+$ type GaAs layer 103 is formed a gate electrode line 113. A depleted layer (not illustrated) extends from a p-n junction which is to be formed between the $p^+$ type GaAs layer 103 and the n-type GaAs layer 107, mainly toward the n-type GaAs layer 107. A width of the depleted layer is controlled by a voltage applied to the gate electrode line 113 to thereby control a current running between the drain electrode line 111 and the source electrode line 112.

A diffusion potential of a p-n junction which restricts a forward signal voltage amplitude of a gate of a normally off junction FET is able to be increased up to a potential nearly equal to a band gap of a semiconductor forming the p-n junction. In the junction type FET illustrated in FIG. 1, there can be obtained approximately 1.2 volts which is sufficient for operation of the junction type FET.

In addition, a high gate voltage can be applied to a gate of the above mentioned junction type FET, and hence it is possible to set a saturation current to be high to thereby obtain a high mutual conductance. As a result, a high speed operation of LSI can be achieved.

In the above mentioned prior junction type FET, since a width of a gate electrode layer is determined by etching crystals by means of lithography technique, it was quite difficult to remarkably shorten a gate length. A dimension of a minimum pattern to be formed by crystal etching is approximately 0.5 μm in the present technique. Thus, it is impossible to shorten a gate length of a junction type FET to be shorter than 0.5 μm, and thereby it is also impossible to further increase an operation speed of a junction type FET.

SUMMARY OF THE INVENTION

In view of the foregoing problem, it is an object of the present invention to provide a junction type FET which can achieve a gate length smaller than a minimum length achievable by the present lithography technique.

The invention provides a junction type field-effect transistor including (a) a multi-layer structure having a first undoped semiconductor layer, a first first-conductive type semiconductor layer and a second undoped semiconductor layer, the layers being deposited and epitaxially grown in this order on a surface of a semiconductor substrate, a part of the first first-conductive type semiconductor layer being exposed to a surface of the multi-layer structure, b) a second-conductive semiconductor layer joined to the multi-layer structure through the surface of said multi-layer structure, (c) a drain electrode line and a source electrode line each being kept in ohmic contact with the second-conductive type semiconductor layer, the drain and source electrode lines being disposed at opposite sides of a location at which the first first-conductive type semiconductor layer is joined to the second-conductive type semiconductor layer, and (d) a gate electrode line being kept in ohmic contact with the first first-conductive type semiconductor layer.

In a preferred embodiment, each of the first undoped semiconductor layer, first first-conductive type semiconductor layer, second undoped semiconductor layer and second-conductive type semiconductor layer is composed of a III–V compound semiconductor. The III–V compound semiconductor preferably is GaAs.

In another preferred embodiment, at least one of the first undoped semiconductor layer and the second undoped semiconductor layer has a first band gap larger than that of the first first-conductive type semiconductor layer.

In still another preferred embodiment, a semiconductor having the first band gap is $Al_{x1}Ga_{1-x1}As$ ($0<x1<1$), and a semiconductor having a band gap smaller than the first band gap is GaAs.

In yet another preferred embodiment, the junction type field-effect transistor further includes a second first-conductive type semiconductor layer located between the first undoped semiconductor layer and/or the second undoped semiconductor layer one or both of which has/have the first band gap, and said first first-conductive type semiconductor layer. The second first-conductive type semiconductor layer has a second band gap larger than that of the first first-conductive type semiconductor layer but smaller than the first band gap. The second first-conductive type semiconductor layer is depleted to thereby form a heterojunction with the first first-conductive type semiconductor layer and the first undoped semiconductor layer and/or the second undoped semiconductor layer.

In still yet another preferred embodiment, a semiconductor having the first band gap is $Al_{x1}Ga_{1-x1}As$ ($0<x1<1$), a semiconductor having the second band gap is $Al_{x2}Ga_{1-x2}As$ ($0<x2<1$), and a semiconductor having a band gap smaller than the second band gap is GaAs.

The invention also provides a junction type field-effect transistor including (a) a multi-layer structure including a first undoped semiconductor layer, a first first-conductive type semiconductor layer and a second undoped semiconductor layer, these layers being deposited and epitaxially grown in this order on a surface of a semiconductor substrate, a part of the first first-conductive type semiconductor layer being exposed to a surface of the multi-layer structure, (b) a carrier supply layer including a second-conductive semiconductor layer joined to the multi-layer structure through the surface of the multi-layer structure, (c) a channel layer including a third undoped semiconductor layer joined to the carrier supply layer, (d) a drain electrode line and a source electrode line each being kept in ohmic contact with the second-conductive type semiconductor layer, the drain and source electrode lines being disposed at opposite sides of a location at which the first first-conductive type semiconductor layer is joined to the second-conductive type semiconductor layer, and (e) a gate electrode line being kept in ohmic contact with the first first-conductive type semiconductor layer.

In a preferred embodiment, each of the first undoped semiconductor layer, first first-conductive type semiconductor layer, second undoped semiconductor layer, second-conductive type semiconductor layer and third undoped semiconductor layer is composed of a III-V compound semiconductor.

In another preferred embodiment, the second-conductive type semiconductor layer is composed of $Al_yGa_{1-y}As$ (0<y<1), and the first undoped semiconductor layer, first first-conductive type semiconductor layer, second undoped semiconductor layer and third undoped semiconductor layer are composed of GaAs.

In still another preferred embodiment, at least one of the first undoped semiconductor layer and the second undoped semiconductor layer has a first band gap larger than that of the first first-conductive type semiconductor layer.

In yet another preferred embodiment, a semiconductor having the first band gap is $Al_{z1}Ga_{1-z1}As$ (0<z1<1), and a semiconductor having a band gap smaller than the first band gap is GaAs.

In still yet another preferred embodiment, the junction type field-effect transistor further includes a second first-conductive type semiconductor layer located between the first undoped semiconductor layer and/or the second undoped semiconductor layer one or both of which has/have the first band gap, and the first first-conductive type semiconductor layer. The second first-conductive type semiconductor layer has a second band gap larger than that of the first first-conductive type semiconductor layer but smaller than the first band gap. The second first-conductive type semiconductor layer is depleted to thereby form a heterojunction with the first first-conductive type semiconductor layer and the first undoped semiconductor layer and/or the second undoped semiconductor layer.

In further preferred embodiment, a semiconductor having the first band gap is $Al_{z1}Ga_{1-z1}As$ (0<z1<1), a semiconductor having the second band gap is $Al_{z2}Ga_{1-z2}As$ (0<z2<z1), and a semiconductor having a band gap smaller than said second band gap is GaAs.

The advantages obtained by the aforementioned present invention will be described hereinbelow.

In accordance with the invention, a gate length is determined only by a length of a portion at which the first first-conductive type semiconductor layer is joined to the second-conductive type semiconductor layer, and hence a gate length is not subject to the lithography technique. As mentioned in detail in the embodiments, a width of a semiconductor layer is determined by an accuracy of a crystal growth process and not by a lithography technique. Hence, a width of a semiconductor layer can be formed thinner than 0.1 μm. Accordingly, a gate length can be formed shorter than that of a prior junction type FET, resulting in that it is possible to provide a junction type FET which can operate at a speed higher than 100 GHz with respect to a cut-off frequency $f_T$.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 10A is a top plan view for an explanation of how the third embodiment is fabricated.

FIG. 10B is a cross-sectional view taken along the line X—X in FIG. 10A.

FIG. 11A is a top plan view for an explanation of how the third embodiment is fabricated.

FIG. 11B is a cross-sectional view taken along the line XI—XI in FIG. 11A.

FIG. 12A is a top plan view for an explanation of how the third embodiment is fabricated.

FIG. 12B is a cross-sectional view taken along the line XII—XII in FIG. 12A.

DESCRIPTION OF THE PREFERRED EMBODIMENTS

Preferred embodiments in accordance with the present invention will be explained hereinbelow with reference to drawings.

Figure 1:
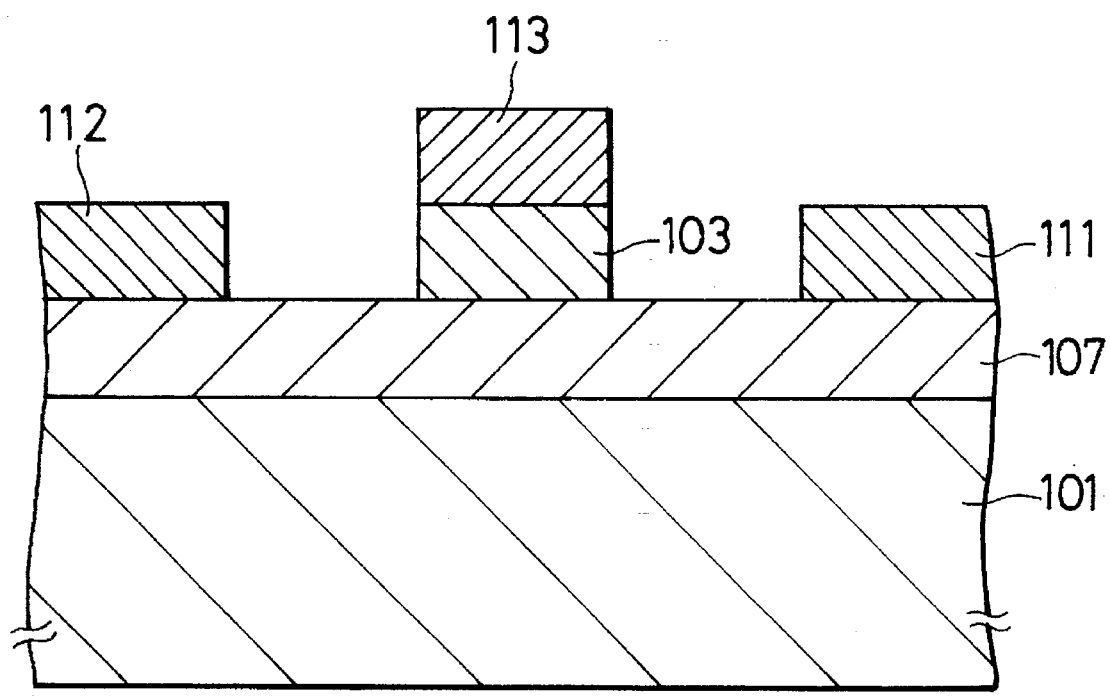
FIG. 1 is a cross-sectional view of a prior junction type FET.
Figure 2A:
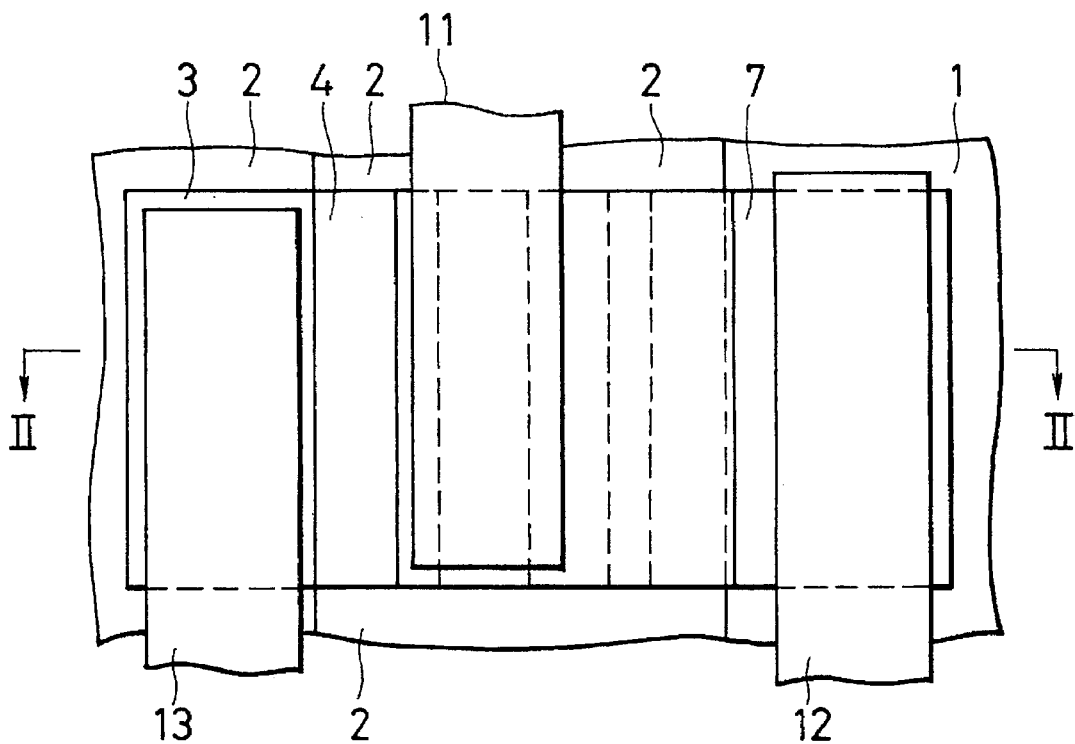
FIG. 2A is a top plan view of a first embodiment in accordance with the invention.
Figure 2B:
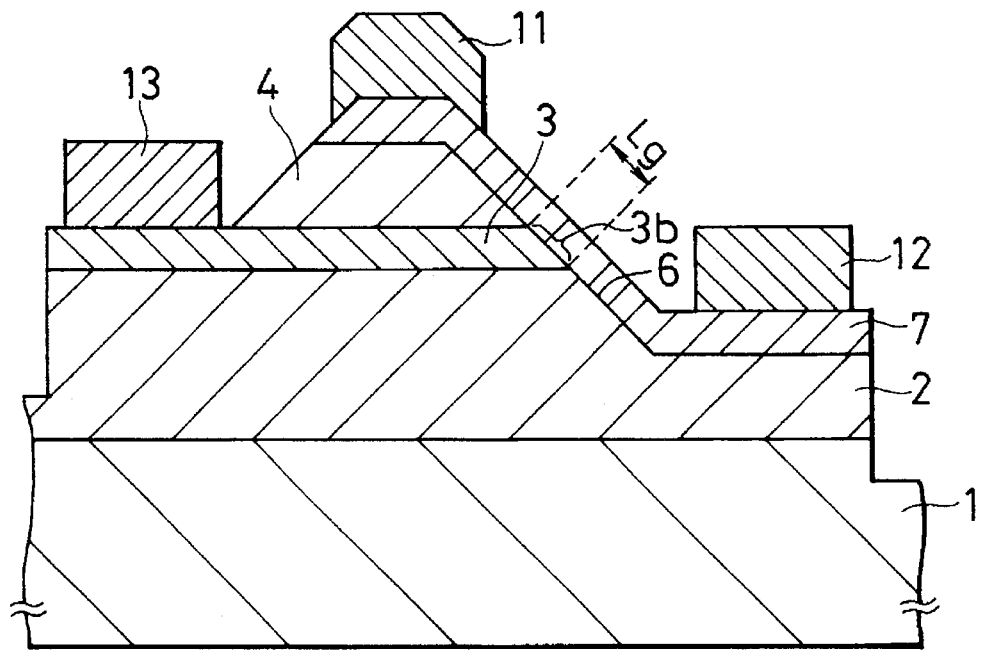
FIG. 2B is a cross-sectional view taken along the line II—II in FIG. 2A.

FIGS. 2A and 2B illustrate a junction type FET in accordance with a first embodiment of the present invention.

In this embodiment, a multi-layer structure is formed on a semi-insulating GaAs substrate 1. The multi-layer structure is composed of a first undoped GaAs layer 2, a p+ type GaAs layer 3 and a second undoped GaAs layer 4. These layers 2, 3 and 4 are deposited and epitaxially grown on an upper surface of a semi-insulating GaAs substrate 1. The multi-layer structure has a side surface 6, and a part of the p+ type GaAs layer 3 extends along to the side surface 6. A n-type GaAs layer 7 is joined to the multi-layer structure along the side surface 6 of the multi-layer structure. On the n-type GaAs layer 7 are formed a drain electrode line 11 and a source electrode line 12 each of which is kept in ohmic contact with the n-type GaAs layer 7. The drain electrode line 11 and the source electrode line 12 are disposed at opposite sides of a joint portion 3b at which the p+ type GaAs layer 3 is joined to the n-type GaAs layer 7. A gate electrode line 13 is formed on the p+ type GaAs layer 3 and is in ohmic contact with the p+ type GaAs layer 3.

Hereinbelow will be explained a method of fabricating the above mentioned junction type FET in accordance with the first embodiment.

Figure 3A:
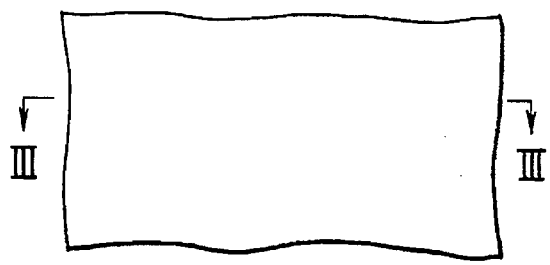
FIG. 3A is a top plan view for an explanation of how the first embodiment is fabricated.
Figure 3B:
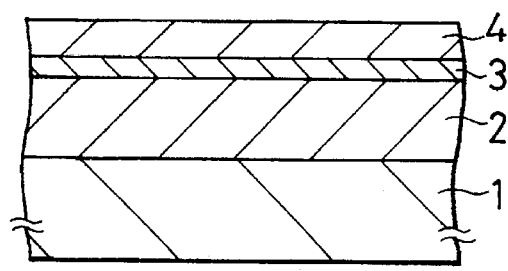
FIG. 3B is a cross-sectional view taken along the line III—III in FIG. 3A.

First, as illustrated in FIGS. 3A and 3B, on an entire surface (100) of the semi-insulating GaAs substrate 1 is deposited the first undoped GaAs layer 2 having a thickness of 1 μm by means of molecular beam epitaxy (MBE). The undoped GaAs layer 2 is a layer into which impurities are not doped intentionally, and has the resistivity in the range of $10^3$ to $10^4$ Ω·cm which is sufficiently practical in use.

Then, on the first undoped GaAs layer 2 is formed the p+ type GaAs layer 3 which has a thickness of 0.05 μm and into which Be having a concentration of $1 \times 10^{19}$ cm$^{-3}$ was doped, and further on the p+ type GaAs layer 3 is grown the second undoped GaAs layer 4 having a thickness of 0.2 μm. In this embodiment, the crystal growth was carried out by means of MBE, however metalorganic chemical vapor deposition (MOCVD) may be used. In the latter case, a carbon is used as a dopant for the p+ type GaAs layer 3, and a carbon can be doped to the degree of $1 \times 10^{20}$ cm$^{-3}$ to thereby further decrease a gate resistance.

Figure 4A:
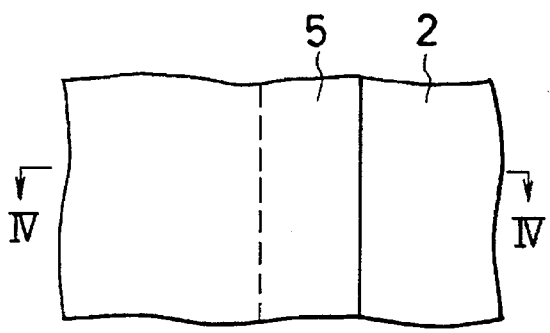
FIG. 4A is a top plan view for an explanation of how the first embodiment is fabricated.
Figure 4B:
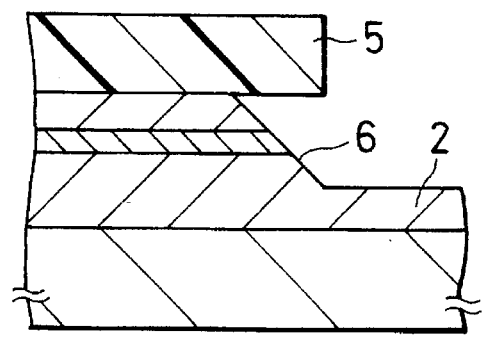
FIG. 4B is a cross-sectional view taken along the line IV—IV in FIG. 4A.
Figure 5A:
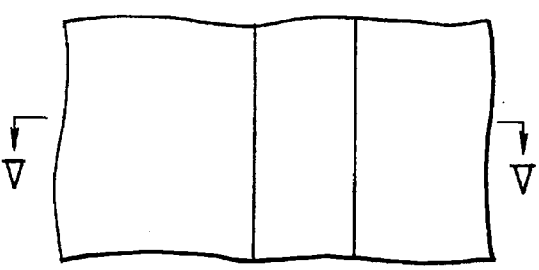
FIG. 5A is a top plan view for an explanation of how the first embodiment is fabricated.
Figure 5B:
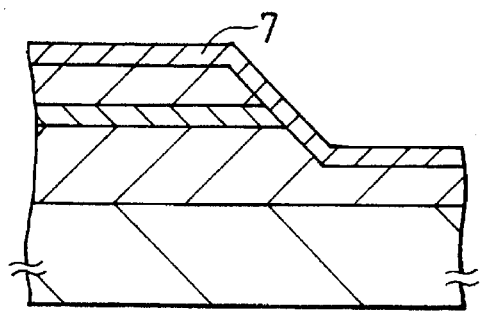
FIG. 5B is a cross-sectional view taken along the line V—V in FIG. 5A.

Then, in order to expose to the outside a side surface of the p+ type GaAs layer 3 sandwiched between the first undoped GaAs layer 2 and the second undoped GaAs layer 4, as illustrated in FIGS. 4A and 4B, on the second undoped GaAs layer 4 is formed a desired pattern composed of a photoresist layer 5. Then, the first undoped GaAs layer 2 is crystal-etched with an aqueous solution of $H_2SO_4$ and $H_2O_2$ to the intermediate thickness thereof. Thus, the isotropic etching forms a slant surface 6 which has an angle of inclination of approximately 45 degrees. After the photoresist layer 5 has been removed, as illustrated in FIGS. 5A and 5B, the n-type GaAs layer 7 working as a channel layer is crystal-grown over an entire surface of the multi-layer structure. In this embodiment, there is epitaxially grown by means of MOCVD a n-type GaAs layer which has a thickness of 200 nm and into which Si was doped so that the concentration of Si is $2 \times 10^{17}$ cm$^{-3}$.

Figure 6A:
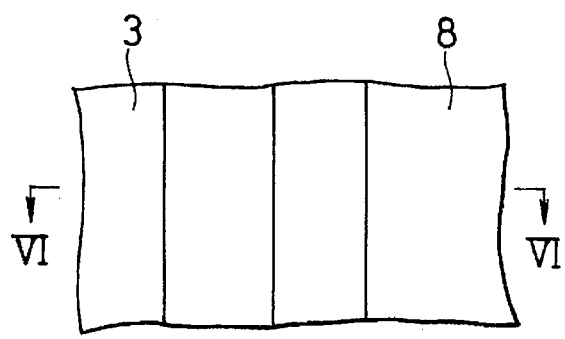
FIG. 6A is a top plan view for an explanation of how the first embodiment is fabricated.
Figure 6B:
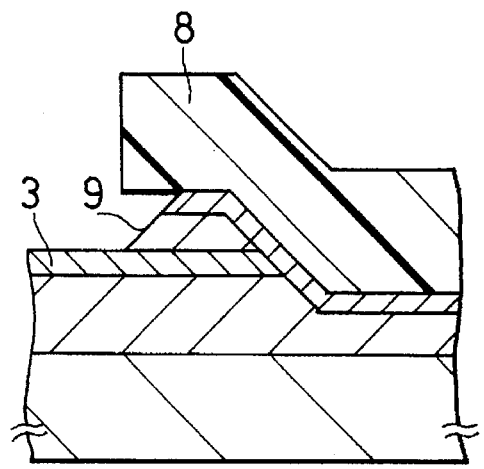
FIG. 6B is a cross-sectional view taken along the line VI—VI in FIG. 6A.

Then, as illustrated in FIGS. 6A and 6B, a region in which a gate electrode is to be formed is crystal-etched by using an aqueous mixture solution of $H_2SO_4$ and $H_2O_2$ with a photoresist layer 8 working as a mask. By carrying out the crystal-etching, the p+ type GaAs layer 3 is exposed outside. A surface 9 formed by the crystal-etching has an angle of inclination of about 45 degrees.

Figure 7A:
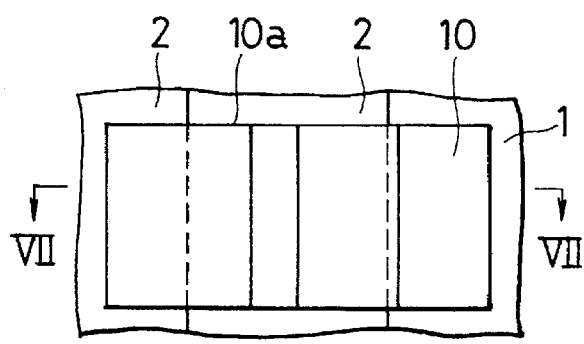
FIG. 7A is a top plan view for an explanation of how the first embodiment is fabricated.
Figure 7B:
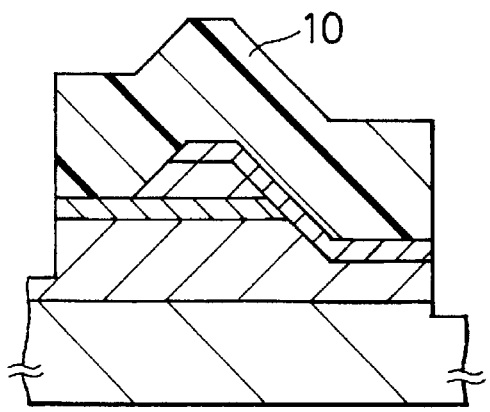
FIG. 7B is a cross-sectional view taken along the line VII—VII in FIG. 7A.

Then, as illustrated in FIGS. 7A and 7B, an anisotropic etching is carried out with a photoresist layer 10 working as a mask. As illustrated in FIG. 7A, the anisotropic etching is continued until neither the p+ type GaAs layer 3 nor the n-type GaAs layer 7 exist in a region outside a rectangular region 10a.

Then, as illustrated in FIGS. 2A and 2B, a gate electrode line 13 is formed on the p+ type GaAs layer 3 by a lift-off process. A metal layer used to form the gate electrode line 13 is a deposited metal multi-layer structure consisting of a Ti layer having a thickness of 50 nm, a Pt layer having a thickness of 150 nm and a gold layer having a thickness of 300 nm.

Furthermore, on the n-type GaAs layer 7 are formed by means of a lift-off process the drain electrode line 11 and the source electrode line 12 each of which is composed of an Au-Ge alloy layer having a thickness of 200 nm and a Ni layer having a thickness of 500 nm. Then, the resultant is subject to heat-treatment at 420 degrees centigrade in $H_2$ atmosphere for 2 minutes to thereby make an alloy of the n-type GaAs layer 7. The n-type GaAs layer 7 works as a channel layer of the junction type FET. A current running between the drain electrode line 11 and the source electrode line 12 each of which is in ohmic contact with the n-type GaAs layer 7 is controlled by a voltage to be applied to the gate electrode line 13 which is in ohmic contact with the p+ type GaAs layer 3 or gate electrode layer.

A gate length Lg of the illustrated junction type FET is dependent on the thickness of the p+ type GaAs layer 3 and the inclination angle of the slant surface 6. It is necessary to form the p+ type GaAs layer 3 thinner in order to shorten the gate length Lg to thereby enhance the performance of the junction type FET. It is possible to grow the p+ type GaAs layer 3 in a thickness smaller than 0.1 μm with high accuracy by epitaxially crystal-growing the layer 3 using MBE or MOCVD. In this embodiment, the p+ type GaAs layer 3 was formed to have a thickness of 0.05 μm. Since the inclination angle of the slant surface 6 is about 45 degrees, the gate length Lg is calculated as follows.

$$Lg = 0.05 \div \sin 45° = 0.07 \, [\mu m]$$

It is important to decrease a gate resistance as much as possible for enhancing the performance of a junction type FET. Thus, p-type dopant having a concentration of $1 \times 10^{19}$ cm$^{-3}$ or higher is preferably doped into the p+ type GaAs layer 3.

A cut-off frequency $f_T$, which is defined as a frequency at which a current gain of a junction type FET is equal to one (1), was measured with respect to the thus fabricated junction type FET. The results of the measurement was that the cut-off frequency of the junction type FET was 100 GHz or higher. Considering from the fact that a prior GaAs junction type FET having a gate length of approximately 05 μm has a cut-off frequency of approximately 30 GHz, it is obvious that the present invention remarkably enhances the performance of a junction type FET.

Figure 8:
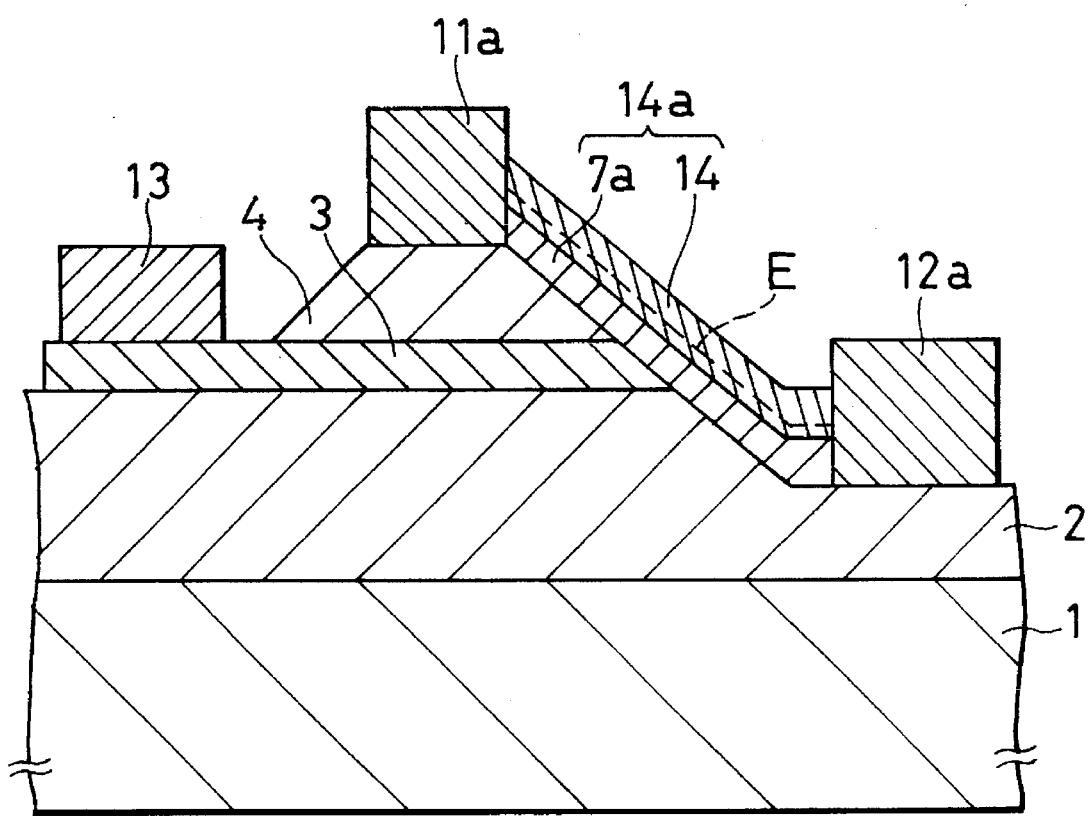
FIG. 8 is a cross-sectional view of a second embodiment in accordance with the invention.

FIG. 8 illustrates a second embodiment of a junction type FET in accordance with the invention in which a semiconductor heterojunction is utilized.

The illustrated second embodiment has a deposited layers structure 14a consisting of a n-type $Al_yGa_{1-y}As$ layer 7a (0<y<1, for instance y is equal to 0.25) working as an electron supply layer and a third undoped GaAs layer 14, in place of the n-type GaAs layer 7 in the first embodiment. The second embodiment has the same structure as that of the first embodiment except the above mentioned deposited layers 14a replaced with the n-type GaAs layer 7. Into the n-type $Al_yGa_{1-y}As$ layer 7a is doped Si at the concentration of $2 \times 10^{18}$ cm$^{-3}$, and the n-type $Al_yGa_{1-y}As$ layer 7a has a thickness of 40 nm. The third undoped GaAs layer 14 is formed to have a thickness of 200 nm. The n-type $Al_yGa_{1-y}As$ layer 7a and the third undoped GaAs layer 14 form a semiconductor heterojunction therebetween. In proximity to the heterojunction in the third undoped GaAs layer 14 having a larger electron affinity than that of the n-type $Al_yGa_{1-y}As$ layer 7a is produced a layer in which electrons are accumulated. This layer generates two-dimensional electron gas E shown by a broken line, which in turn generates a current which is to run between a drain electrode line 11a and a source electrode line 12a. The thus generated current is controlled by a voltage applied to the $p^+$ type GaAs layer 3 through the gate electrode line 13.

A method of fabricating a junction type FET in accordance with the second embodiment is similar to that of the first embodiment.

The second embodiment can provide a higher transconductance than the first embodiment to thereby achieve a higher cut-off frequency $f_T$ than the first embodiment. In addition, a diffusion potential in the junction of the $p^+$ GaAs layer 3 and the n-type $Al_yGa_{1-y}As$ layer 7a is higher than a diffusion potential in the junction of the n-type GaAs layer 7 and the $p^+$ GaAs layer 3 in the first embodiment, and hence the second embodiment provides an advantage that a higher gate voltage can be applied to.

In the above mentioned first and second embodiments, in place of at least one of the first undoped GaAs layer 2 and the second undoped GaAs layer 4, in particular, in place of the second undoped GaAs layer, an undoped $Al_{0.4}Ga_{0.6}As$ layer may be used in which case it is possible to decrease a leak current from the $p^+$ GaAs layer 3 or gate electrode layer.

Figure 9A:
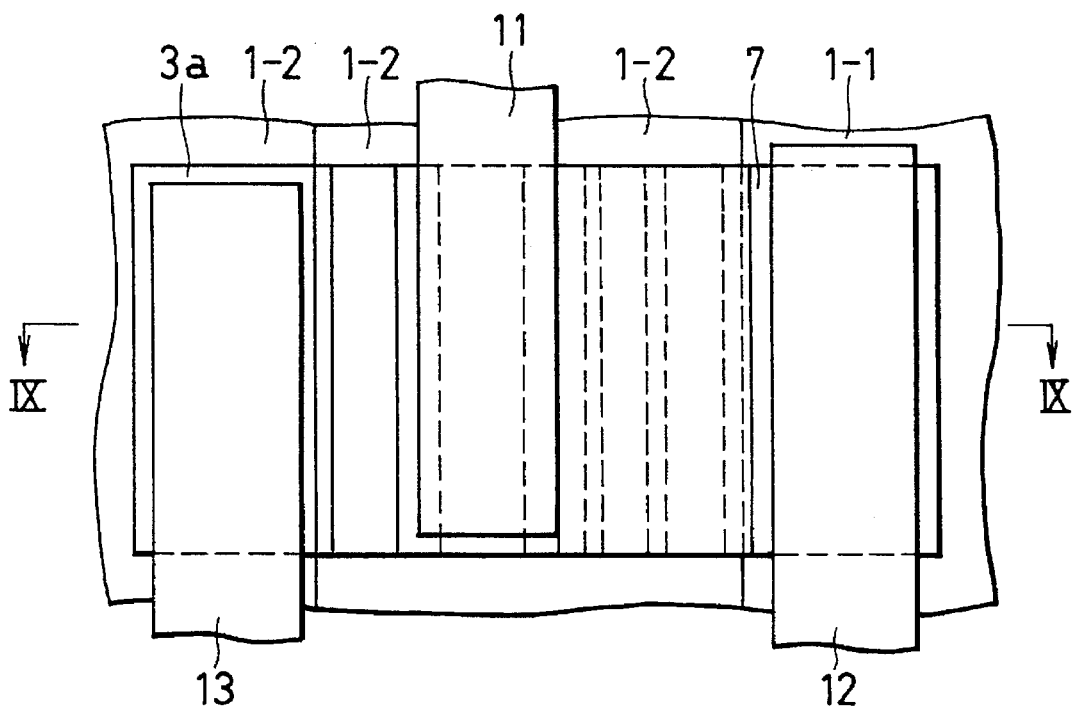
FIG. 9A is a top plan view of a third embodiment in accordance with the invention.
Figure 9B:
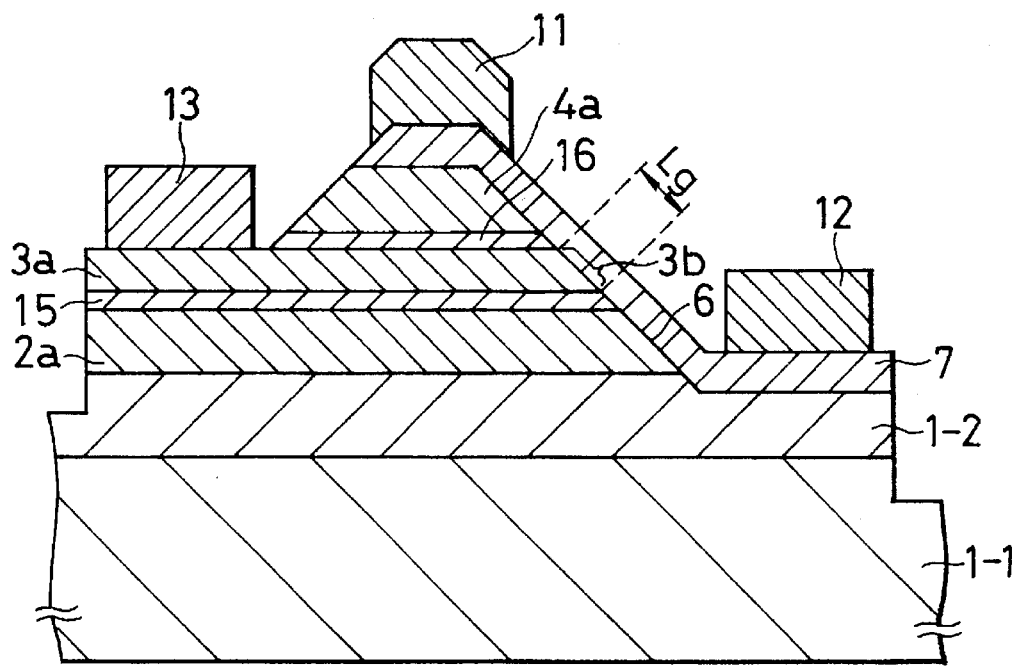
FIG. 9B is a cross-sectional view taken along the line IX—IX in FIG. 9A.

FIGS. 9A and 9B illustrate a third embodiment of a junction type FET in accordance with the invention.

In this embodiment, on a semi-insulating GaAs substrate 1-1 is first formed a buffer layer 1-2 composed of an epitaxially grown undoped GaAs layer. On the buffer layer 1-2 is formed a multi-layer structure. The multi-layer structure is composed of a first undoped $Al_{0.4}Ga_{0.6}As$ layer 2a, a first $p^+$ type $Al_{0.3}Ga_{0.7}As$ layer 15, a $p^+$ type GaAs layer 3a, a second $p^+$ type $Al_{0.3}Ga_{0.7}As$ layer 16 and a second undoped $Al_{0.4}Ga_{0.6}As$ layer 4a. These layers 2a, 15, 3a, 16 and 4a are deposited and epitaxially grown on the buffer layer 1-2. The multi-layer structure has a side surface 6, and a part of the $p^+$ type GaAs layer 3a is exposed to the side surface 6. A n-type GaAs layer 7 is joined to the multi-layer structure along the side surface 6 of the multi-layer structure. On the n-type GaAs layer 7 are formed a drain electrode line 11 and a source electrode line 12 each of which is kept in ohmic contact with the n-type GaAs layer 7. The drain electrode line 11 and the source electrode line 12 are disposed at opposite sides of a joint portion 3b at which the $p^+$ type GaAs layer 3a is joined to the n-type GaAs layer 7. A gate electrode line 13 is formed on the $p^+$ type GaAs layer 3a in ohmic contact with the $p^+$ type GaAs layer 3a Hereinbelow will be explained a method of fabricating the above mentioned junction type FET in accordance with the third embodiment.

First, as illustrated in FIGS. 10A and 10B, on an entire surface (100) of the semi-insulating GaAs substrate 1-1 is deposited an undoped GaAs layer 1-2 having a thickness of 1 μm, and then on the undoped GaAs layer 1-2 is deposited a first undoped $Al_{0.4}Ga_{0.6}As$ layer 2a having a thickness of 0.1 μm both by means of molecular beam epitaxy (MBE). The undoped GaAs layer 1-2 and the first undoped $Al_{0.4}Ga_{0.6}As$ layer 2a are layers into which impurities are not doped intentionally, and each has the resistivity in the range of $10^3$ to $10^4$ Ω·cm which is sufficiently practical in use.

Then, on the first undoped $Al_{0.4}Ga_{0.6}As$ layer 2a are deposited the first $p^+$ type $Al_{0.3}Ga_{0.7}As$ layer 15 having a thickness of 5 nm, the GaAs layer 3a having a thickness of 20 nm, and the second $p^+$ type $Al_{0.3}Ga_{0.7}As$ layer 16 having a thickness of 5 nm in this order by means of MBE. Into each of the layers 15, 3a and 16 is doped Be having a concentration of $3 \times 10^{18}$ cm$^{-3}$.

Then, on the second $p^+$ type $Al_{0.3}Ga_{0.7}As$ layer 16 is grown by MBE the second undoped $Al_{0.4}Ga_{0.6}As$ layer 4a having a thickness of 0.1 μm.

Then, in order to expose to the outside a side surface of the $p^+$ type GaAs layer 3a sandwiched between the first undoped $Al_{0.4}Ga_{0.6}As$ layer 2a and the second undoped $Al_{0.4}Ga_{0.6}As$ layer 4a, as illustrated in FIGS. 11A and 11B, on the second undoped $Al_{0.4}Ga_{0.6}As$ layer 4a is formed a desired pattern composed of a photoresist layer 5. Then, the first undoped GaAs layer 1-2 is etched with an aqueous solution of $H_2SO_4$ and $H_2O_2$ to the intermediate thickness thereof. Thus, the isotropic etching forms a slant surface 6 which has an angle of inclination of approximately 45 degrees. After the photoresist layer 5 has been removed, as illustrated in FIGS. 12A and 12B, the n-type GaAs layer 7 working as a channel layer is crystal-grown over an entire surface of the multi-layer structure. In this embodiment, there is epitaxially grown by means of MOCVD the n-type GaAs layer 7 which has a thickness of 0.2 μm and into which Si was doped so that the concentration of Si is $2 \times 10^{17}$ cm$^{-3}$.

Figure 13A:
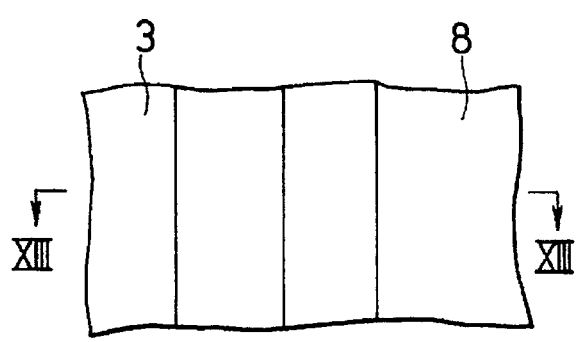
FIG. 13A is a top plan view for an explanation of how the third embodiment is fabricated.
Figure 13B:
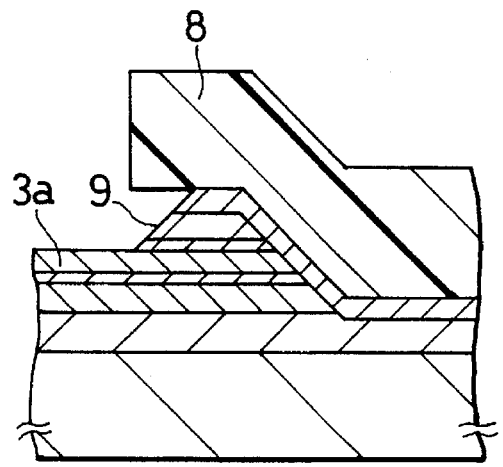
FIG. 13B is a cross-sectional view taken along the line XIII—XIII in FIG. 13A.

Then, as illustrated in FIGS. 13A and 13B, a region in which a gate electrode is to be formed is etched by using an aqueous mixture solution of $H_2SO_4$ and $H_2O_2$ with a photoresist layer 8 working as a mask. By carrying out the etching, the $p^+$ type GaAs layer 3a is exposed outside. A surface 9 formed by the crystal-etching has an angle of inclination of about 45 degrees.

If a selective etching technique is used for etching $Al_{0.3}Ga_{0.7}As$ and GaAs, it is possible to stop the etching just on the $p^+$ type GaAs layer 3a. For instance, if a reactive ion etching using $Cl_2$ gas is used, it would be possible to remove the $Al_{0.3}Ga_{0.7}As$ layer at an etching speed approximately two times greater than an etching speed of the GaAs layer. In addition, if an etching is being carried out detecting whether Al is present by using a plasma end point monitor, it would be possible to stop the etching with higher accuracy at the time when the $p^+$ type GaAs layer 3a is just exposed to the outside. Since the $p^+$ type GaAs layer 3a is formed remarkably thin, specifically 0.02 μm thick, in the embodiment, it is quite important to controllably stop the etching just on the $p^+$ type GaAs layer 3a.

Figure 14A:
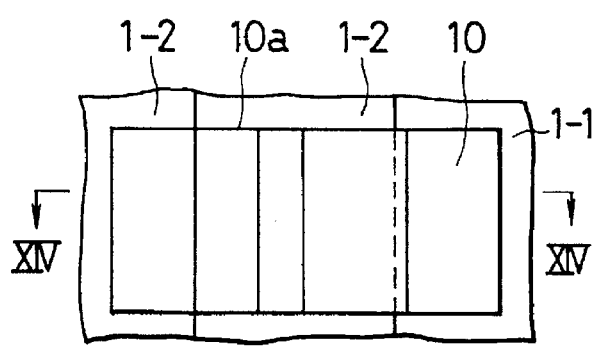
FIG. 14A is a top plan view for an explanation of how the third embodiment is fabricated.
Figure 14B:
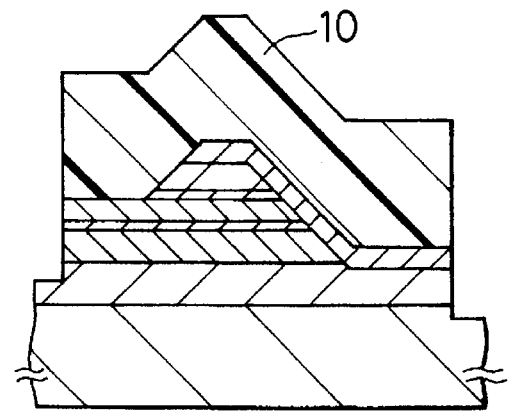
FIG. 14B is a cross-sectional view taken along the line XIV—XIV in FIG. 14A.

Then, as illustrated in FIGS. 14A and 14B, an anisotropic etching is carried out by using a reactive ion etching with $Cl_2$ gas in which a photoresist layer 10 is used as a mask. As illustrated in FIG. 14A, the anisotropic etching is continued until either the first undoped GaAs layer 1-2 or the semi-insulating GaAs substrate 1-1 is exposed in a region outside a rectangular region 10a.

Then, as illustrated in FIGS. 9A and 9B, a gate electrode line 13 is formed on the $p^+$ type GaAs layer 3a by a lift-off process. A metal layer used to form the gate electrode line 13 is a deposited metal multi-layer structure consisting of a Ti layer having a thickness of 50 nm, a Pt layer having a thickness of 150 nm and an Au layer having a thickness of 300 nm.

Furthermore, on the n-type GaAs layer 7 are formed by means of a lift-off process the drain electrode line 11 and the source electrode line 12 each of which is composed of deposited layers including an Au—Ge alloy layer having a thickness of 200 nm, a Ni layer having a thickness of 500 nm and an Au layer having a thickness of 300 nm. Then, the resultant is subject to heat-treatment at 420 degrees centigrade in $H_2$ atmosphere for 2 minutes to thereby make an alloy of the n-type GaAs layer 7.

The n-type GaAs layer 7 works as a channel layer of the junction type FET. A current running between the drain electrode line 11 and the source electrode line 12 each of which is in ohmic contact with the n-type GaAs layer 7 is controlled by a voltage to be applied to the gate electrode line 13 which is in ohmic contact with the $p^+$ type GaAs layer 3a.

A gate length Lg of the illustrated junction type FET is dependent on the thickness of the $p^+$ type GaAs layer 3A and the inclination angle of the slant surface 6. It is necessary to form the $p^+$ type GaAs layer 3A thinner in order to shorten the gate length Lg to thereby enhance the performance of the junction type FET. It is possible to grow the $p^+$ type GaAs layer 3A in a thickness smaller than 0.1 µm with high accuracy by epitaxially crystal-growing the layer 3A using MBE or MOCVD. In this embodiment, the $p^+$ type GaAs layer 3A was formed to have a thickness of 0.02 µm. Since the inclination angle of the slant surface 6 is 45 degrees, the gate length Lg is calculated as follows.

$$Lg = 0.02 \div \sin 45° \approx 0.03 \ [\mu m]$$

Most of holes present in the first $p^+$ type $Al_{0.3}Ga_{0.7}As$ layer 15 and the second $p^+$ type $Al_{0.3}Ga_{0.7}As$ layer 16 are introduced into the $p^+$ type GaAs layer 3a, and thus an electron accumulation layer is formed in the $p^+$ type GaAs layer 3a. Accordingly, both of the first $p^+$ type $Al_{0.3}Ga_{0.7}As$ layer 15 and the second $p^+$ type $Al_{0.3}Ga_{0.7}As$ layer 16 become depleted. The accumulated holes increase the hole concentration of the $p^+$ type GaAs layer 3a by approximately 30%, to thereby decrease the gate resistance. Thus, the embodiment not only decrease the leak current from the gate electrode layer but also further improve frequency characteristics.

A cut-off frequency $f_T$, which is defined as a frequency at which a current gain of a junction type FET is equal to one (1), was measured with respect to the thus fabricated junction type FET. The results of the measurement was that the cut-off frequency of the junction type FET was 150 GHz or higher. Considering from the fact that a prior GaAs junction type FET having a gate length of approximately 0.5 µm has a cut-off frequency of approximately 30 GHz, it is obvious that the present invention remarkably enhances the performance of a junction type FET.

Figure 15:
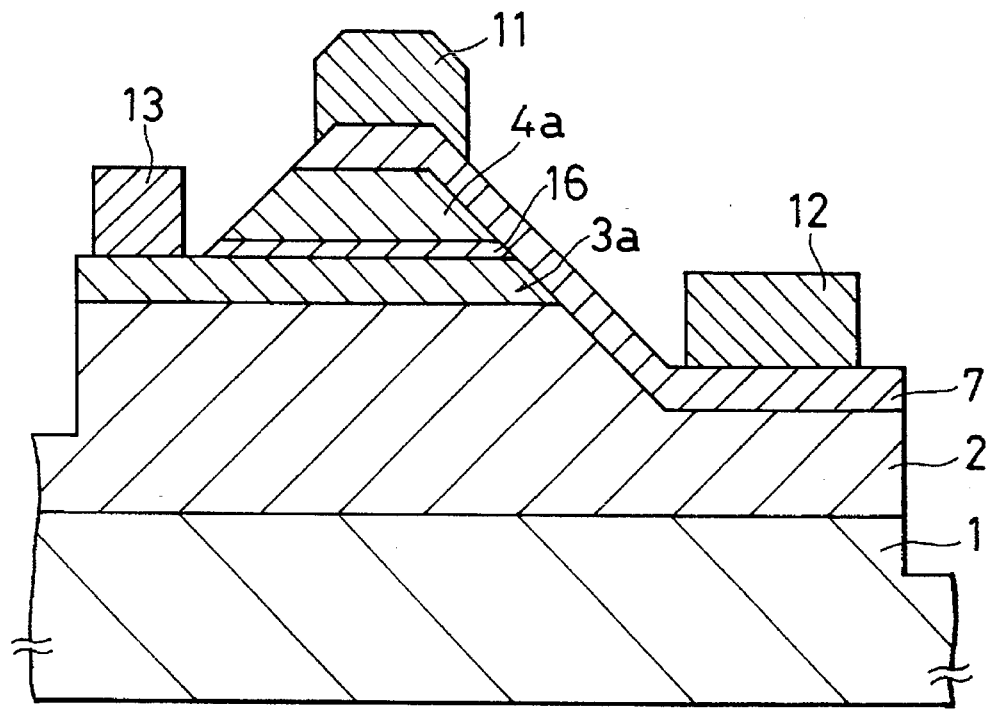
FIG. 15 is a cross-sectional view of a fourth embodiment in accordance with the invention.

FIG. 15 illustrates a fourth embodiment of a junction type FET in accordance with the invention.

In this embodiment, the $p^+$ type $Al_{0.3}Ga_{0.7}As$ layer 16 and the undoped $Al_{0.4}Ga_{0.6}As$ layer 4a both having a large band gap are formed only on the $p^+$ type GaAs layer 3a, and hence steps for crystal growing are simplified. Though the fourth embodiment has a little larger gate resistance than that of the third embodiment, the fourth embodiment provides a cut-off frequency $f_T$ greater than 150 GHz which is greater than that of the first embodiment.

Figure 16:
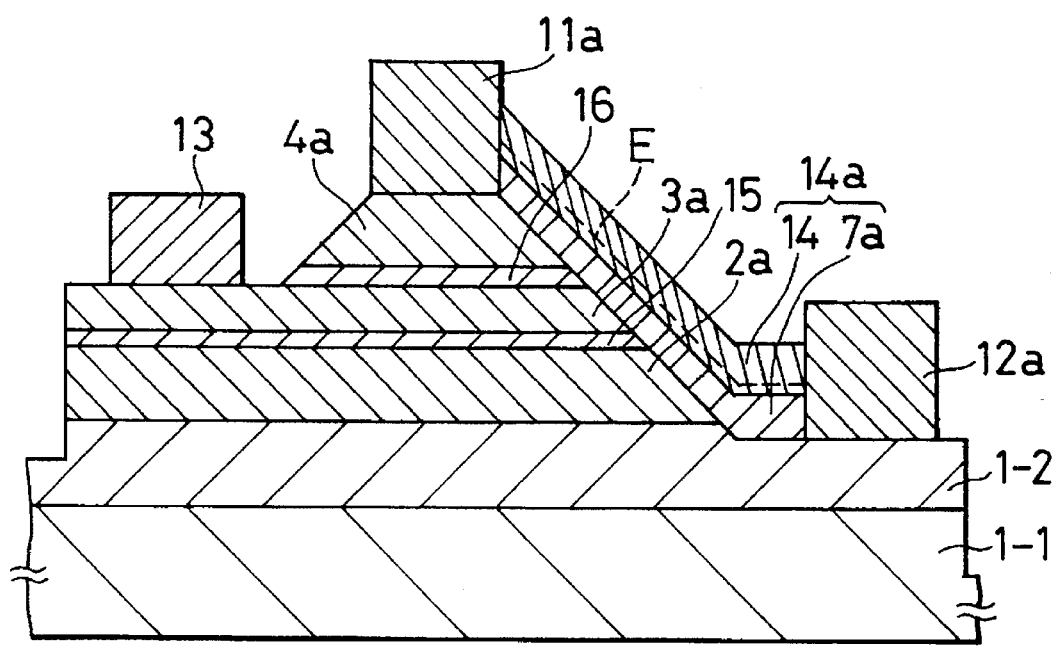
FIG. 16 is a cross-sectional view of a fifth embodiment in accordance with the invention.

FIG. 16 illustrates a sixth embodiment of a junction type FET in accordance with the invention.

In the embodiment, the n-type GaAs layer 7 used in the third embodiment is replaced with a deposited layers structure 14a consisting of a n-type $Al_{0.25}Ga_{0.75}As$ layer 7a working as a layer for supplying electrons and a third undoped GaAs layer 14. The fifth embodiment has the same structure as that of the third embodiment except the above mentioned deposited layers structure 14a replaced with the n-type GaAs layer 7. Into the n-type $Al_{0.25}Ga_{0.75}As$ layer 7a is doped Si at the concentration of $2 \times 10^{18}$ cm$^{-3}$, and the n-type $Al_{0.25}Ga_{0.75}As$ layer 7a has a thickness of 200 nm. The third undoped GaAs layer 14 is formed 200 nm thick. The n-type $Al_{0.25}Ga_{0.75}As$ layer 7a and the third undoped GaAs layer 14 form a semiconductor heterojunction therebetween. In proximity to the heterojunction in the third undoped GaAs layer 14 having a larger electron affinity than that of the n-type $Al_{0.25}Ga_{0.75}As$ layer 7a is produced a layer in which electrons are accumulated. This layer generates two-dimensional electron gas E shown by a broken line, which in turn generates a current which is to run between a drain electrode line 11a and a source electrode line 12a. The thus generated current is controlled by a voltage applied to the $p^+$ type GaAs layer 3a through the gate electrode line 13.

A method of fabricating a junction type FET in accordance with the fifth embodiment is similar to that of the third embodiment.

The fifth embodiment can provide a higher transconductance than the third embodiment to thereby achieve a higher cut-off frequency $f_T$ than the third embodiment. In addition, a diffusion potential in the junction of the $p^+$ GaAs layer 3 and the n-type $Al_{0.25}Ga_{0.75}As$ layer 7a is higher than a diffusion potential in the junction of the n-type GaAs layer 7 and the $p^+$ GaAs layer 3a in the third embodiment, and hence the fifth embodiment provides an advantage that a higher gate voltage can be applied to.

In the embodiments having been mentioned so far, GaAs or GaAs-$Al_yGa_{1-y}As$ are used as an example. However, it should be noted that other chemical compound semiconductors such as those including InP or $In_{1-u}Ga_uAs_wP_{1-w}$ and so on are allowed to be applied to the present invention.

It does not matter whether a conductive type of the first and second undoped semiconductor layers is a first one or a second one. A resistivity of the undoped semiconductor layers is preferably high as much as possible. As the undoped semiconductor layers are used layers in which impurities are not doped intentionally and which have the highest purity achievable in the present technique.

Similarly to the first and second undoped semiconductor layers, it also does not matter whether the third undoped semiconductor has a first-conductive or second-conductive type, and the third semiconductor layer is formed to have the highest purity achievable in the present technique. What is necessary is that the third undoped semiconductor layer can form a heterojunction with the second-conductive type semiconductor layer, and that a carder accumulation layer can be formed in dependence on the gate voltage in the vicinity of the heterojunction.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A junction type field-effect transistor comprising:
   a multi-layer structure including a first undoped semiconductor layer, a first first-conductive type semiconductor layer on said first undoped semiconductor layer and a second undoped semiconductor layer on said first first-conductive type semiconductor layer, said layers being deposited and epitaxially grown in this order on a surface of a semiconductor substrate, a side surface of said first first-conductive type semiconductor layer being between said first and second undoped semiconductor layers of said multi-layer structure;

a second-conductive semiconductor layer joined to said side surface of said first first-conductive type semiconductive layer and surfaces of said first and second undoped semiconductor layers;

a drain electrode line and a source electrode line each in ohmic contact with said second-conductive type semiconductor layer, said drain and source electrode lines being disposed at opposite sides of a location at which said first first-conductive type semiconductor layer is joined to said second-conductive type semiconductor layer; and a gate electrode line in ohmic contact with said first first-conductive type semiconductor layer.

2. The junction type field-effect transistor as recited in claim 1, wherein each of said first undoped semiconductor layer, first first-conductive type semiconductor layer, second undoped semiconductor layer and second-conductive type semiconductor layer is composed of a III-V compound semiconductor.

3. The junction type field-effect transistor as recited in claim 2, wherein said III-V compound semiconductor is GaAs.

4. The junction type field-effect transistor as recited in claim 2, wherein at least one of said first undoped semiconductor layer and said second undoped semiconductor layer has a first band gap larger than that of said first first-conductive type semiconductor layer.

5. The junction type field-effect transistor as recited in claim 4, wherein the undoped semiconductor layer having said first band gap is $Al_{x1}Ga_{1-x1}As$ ($0<x1<1$), and the first first-conductive type semiconductor layer having a band gap smaller than said first band gap is GaAs.

6. The junction type field-effect transistor as recited in claim 5 further comprising a second first-conductive type semiconductor layer located between said undoped semiconductor layer and said semiconductor layer one or both of which has/have said first band first first-conductive type semiconductor layer, in which said undoped semiconductor layer has said first band gap, said second first-conductive type semiconductor layer having a second band gap larger than that of said first first-conductive type semiconductor layer but smaller than said first band gap, and said second first-conductive type semiconductor layer being depleted and forming a heterojunction with said first first-conductive type semiconductor layer.

7. The junction type field-effect transistor as recited in claim 6, wherein both said first and second undoped semiconductor layers have said first band gap which is $Al_{x1}Ga_{1-x1}As$ ($0<x1<1$), and the second first-conductive type semiconductor layer has said second band gap which is $Al_{x2}GA_{1-x2}As$ ($0<x2<x1$) and being smaller than said first band gap, and the first first-conductive type semiconductor layer has a band gap smaller than said second band gap which is GaAs.

8. A junction type field-effect transistor comprising:

a multi-layer structure including a first undoped semiconductor layer, a first first-conductive type semiconductor layer on said first undoped semiconductor layer and a second undoped semiconductor layer on said first first-conductive type semiconductor layer, said layers being deposited and epitaxially grown in this order on a surface of a semiconductor substrate, a side surface of said first first-conductive type semiconductor layer being between side surfaces of said first and second undoped semiconductor layers of said multi-layer structure;

a carrier supply layer including a second-conductive semiconductor layer joined to said side surface of said first first-conductive type semiconductor layer and surfaces of said first and second undoped semiconductor layers;

a channel layer including a third undoped semiconductor layer joined to said carrier supply layer;

a drain electrode line and a source electrode line each in ohmic contact with said second-conductive type semiconductor layer, said drain and source electrode lines being disposed at opposite sides of a location at which said first first-conductive type semiconductor layer is joined to said second-conductive type semiconductor layer; and a gate electrode line in ohmic contact with said first first-conductive type semiconductor layer.

9. The junction type field-effect transistor as recited in claim 8, wherein each of said first undoped semiconductor layer, first first-conductive type semiconductor layer, second undoped semiconductor layer, second-conductive type semiconductor layer and third undoped semiconductor layer is composed of a III-V compound semiconductor.

10. The junction type field-effect transistor as recited in claim 9, wherein said second-conductive type semiconductor layer is composed of $Al_yGa_{1-y}As$ ($0<y<1$), and said first undoped semiconductor layer, first first-conductive type semiconductor layer, second undoped semiconductor layer and third undoped semiconductor layer are composed of GaAs.

11. The junction type field-effect transistor as recited in claim 9, wherein at least one of said first undoped semiconductor layer and said second undoped semiconductor layer has a first band gap larger than that of said first first-conductive type semiconductor layer.

12. The junction type field-effect transistor as recited in claim 11, wherein the undoped semiconductor layer having said first band gap is $Al_{z1}Ga_{1-z1}As$ ($0<z1<1$), and the first first-conductive type semiconductor layer having a band gap smaller than said first band gap is GaAs.

13. The junction type field-effect transistor as recited in claim 11 further comprising a second first-conductive type semiconductor layer located between said undoped semiconductor layer and said first first-conductive type semiconductor layer, in which said undoped semiconductor layer has said first band gap, said second first-conductive type semiconductor layer having a second band gap larger than that of said first first-conductive type semiconductor layer but smaller than said first band gap, and said second first-conductive type semiconductor layer being depleted and forming a heterojunction with said first first-conductive type semiconductor layer.

14. The junction type field-effect transistor as recited in claim 13, wherein both said first and second undoped semiconductor layers have said first band gap which is $Al_{z1}GA_{1-z1}As$ ($0<z1<1$), and the second first-conductive type semiconductor layer has said second band gap which is $Al_{z2}Ga_{1-z2}As$ ($0<z2<z1$) and being smaller than said first band gap, and the first first-semiconductor the semiconductor layer has a band gap smaller than said second band gap which is GaAs.

15. The junction type field-effect transistor as recited in claim 5 further comprising a second first-conductive type semiconductor layer located between said first undoped semiconductor layer and said first first-conductive type semiconductor layer, in which said first undoped semiconductor layer has said first band gap, said second first-conductive type semiconductor layer having a second band gap larger than that of said first first-conductive type semiconductor layer but smaller than said first band gap, and said second first-conductive type semiconductor layer being depleted and forming a heterojunction with said first first-conductive type semiconductor layer.

16. The junction type field-effect transistor as recited in claim 5 further comprising a second first-conductive type semiconductor layer located between said second undoped semiconductor layer and said first first-conductive type semiconductor layer, in which said second undoped semiconductor layer has said first band gap, said second first-conductive type semiconductor layer having a second band gap larger than that of said first first-conductive type semiconductor layer but smaller than said first band gap, and said second first-conductive type semiconductor layer being depleted and forming a heterojunction with said first first-conductive type semiconductor layer.

17. The junction type field-effect transistor as recited in claim 5 further comprising a second first-conductive type semiconductor layer located between said first undoped semiconductor layer and said first first-conductive type semiconductor layer, and a second first-conductive type semiconductor layer located between said second undoped semiconductor layer and said first first-conductive type semiconductor layer, in which said first and second undoped semiconductor layers have said first band gap, and said second first-conductive type semiconductor layers having a second band gap larger than that of said first first-conductive type semiconductor layer but smaller than said first band gap, and said second first-conductive type semiconductor layers being depleted and forming a heterojunction with said first first-conductive type semiconductor layer.

18. The junction type field-effect transistor as recited in claim 17, wherein both said first and second undoped semiconductor layers have said first band gap which is $Al_{x1}Ga_{1-x1}As$ ($0<x1<1$), and the second first-conductive type semiconductor layer has said second band gap smaller than said first band gap, which is $Al_{x2}Ga_{1-x2}As$ ($0<x2<1$) and the first first-conductive type semiconductor layer has a band gap smaller than said second band gap which is GaAs.

19. The junction type field-effect transistor as recited in claim 16, wherein both said first and second undoped semiconductor layers have said first band gap which is $Al_{x1}Ga_{1-x1}As$ ($0<x1<1$), and the second first-conductive type semiconductor layer has said second band gap smaller than said first band gap, which is $Al_{x2}Ga_{1-x2}As$ ($0<x2<1$) and the first first-conductive type semiconductor layer has a band gap smaller than said second band gap which is GaAs.

20. The junction type field-effect transistor as recited in claim 15, wherein a first and second undoped semiconductor layer having said first band gap is $Al_{x1}Ga_{1-x1}As$ ($0<x1<1$), and a second first-conductive type semiconductor layer having said second band gap smaller than said first band gap, is $Al_{x2}Ga_{1-x2}As$ ($0<x2<1$) and a first first-conductive type semiconductor layer having a band gap smaller than said second band gap is GaAs.

21. The junction type field-effect transistor as recited in claim 11 further comprising a second first-conductive type semiconductor layer located between said first undoped semiconductor layer and said first first-conductive type semiconductor layer, in which said first undoped semiconductor layer has said first band gap, said second first-conductive type semiconductor layer having a second band gap larger than that of said first first conductive type semiconductor layer but smaller than said first band gap, and said second first-conductive type semiconductor layer being depleted and forming a heterojunction with said first first-conductive type semiconductor layer.

22. The junction type field-effect transistor as recited in claim 11 further comprising a second first-conductive type semiconductor layer located between said second undoped semiconductor layer and said first first-conductive type semiconductor layer, in which said second undoped semiconductor layer has said first band gap, said second first-conductive type semiconductor layer having a second band gap larger than that of said first first-conductive type semiconductor layer but smaller than said first band gap, and said second first-conductive type semiconductor layer being depleted and forming a heterojunction with said first first-conductive type semiconductor layer.

23. The junction type field-effect transistor as recited in claim 11 further comprising a second first-conductive type semiconductor layer located between said first undoped semiconductor layer and said first first-conductive type semiconductor layer, and a second first-conductive type semiconductor layer located between said second undoped semiconductor layer and said first first-conductive type semiconductor layer, in which said first and second undoped semiconductor layers have said first band gap, said second first-conductive type semiconductor layers having a second band gap larger than that of said first first-conductive type semiconductor layer but smaller than said first band gap, and said second first-conductive type semiconductor layers being depleted and forming a heterojunction with said first first-conductive type semiconductor layer.

24. The junction type field-effect transistor as recited in claim 23, wherein both said first and second undoped semiconductor layers have said first band gap which is $Al_{z1}Ga_{1-z1}As$ ($0<z1<1$), and the second first-conductive type semiconductor layer has said second band gap smaller than said first band gap, which is $Al_{x2}Ga_{1-x2}As$ ($0<x2<1$) and the first first-semiconductor type semiconductor layer has a band gap smaller than said second band gap which is GaAs.

25. The junction type field-effect transistor as recited in claim 22, wherein both said first and second undoped semiconductor layers have said first band gap which is $Al_{z1}Ga_{1-z1}As$ ($0<z1<1$), and the second first-conductive type semiconductor layer has said second band gap smaller than said first band gap, which is $Al_{x2}Ga_{1-x2}As$ ($0<x2<1$) and the first first-semiconductor type semiconductor layer has a band gap smaller than said second band gap which is GaAs.

26. The junction type field-effect transistor as recited in claim 21, wherein both said first and second undoped semiconductor layers have said first band gap which is $Al_{x1}Ga_{1-x1}As$ ($0<x1<1$), and the second first-conductive type semiconductor layer has said second band gap smaller than said first band gap, which is $Al_{x2}Ga_{1-x2}As$ ($0<x2<1$) and the first first-semiconductor type semiconductor layer has a band gap smaller than said second band gap which is GaAs.

* * * * *